(12) United States Patent
Kamakura

(10) Patent No.: US 10,121,650 B1
(45) Date of Patent: Nov. 6, 2018

(54) METHOD OF MANUFACTURING SEMICONDUCTOR DEVICE

(71) Applicant: HITACHI KOKUSAI ELECTRIC INC., Tokyo (JP)

(72) Inventor: Tsukasa Kamakura, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 15/940,618

(22) Filed: Mar. 29, 2018

(30) Foreign Application Priority Data

Feb. 7, 2018 (JP) .................. 2018-020005

(51) Int. Cl.
| | |
|---|---|
| *H01L 21/02* | (2006.01) |
| *H01L 21/285* | (2006.01) |
| *H01J 37/32* | (2006.01) |
| *C23C 16/455* | (2006.01) |
| *H01L 21/28* | (2006.01) |
| *H01L 27/11582* | (2017.01) |
| *H01L 21/677* | (2006.01) |

(52) U.S. Cl.
CPC ...... *H01L 21/02104* (2013.01); *C23C 16/455* (2013.01); *C23C 16/45502* (2013.01); *C23C 16/45519* (2013.01); *C23C 16/45521* (2013.01); *C23C 16/45523* (2013.01); *C23C 16/45557* (2013.01); *H01J 37/32816* (2013.01); *H01J 37/32834* (2013.01); *H01L 21/02211* (2013.01); *H01L 21/28282* (2013.01); *H01L 21/28556* (2013.01); *H01L 27/11582* (2013.01); *H01L 21/67739* (2013.01)

(58) Field of Classification Search
CPC ......... H01L 21/28282; H01L 21/02104; H01L 21/02211; H01L 21/28556; C23C 16/455; C23C 16/45502; C23C 16/45519; C23C 16/45521; C23C 16/45557; C23C 16/45523; H01J 37/32834; H01J 37/32816
See application file for complete search history.

(56) References Cited

U.S. PATENT DOCUMENTS

| | | | | |
|---|---|---|---|---|
| 2006/0086259 | A1* | 4/2006 | Okajo | H01J 37/3244 99/342 |
| 2014/0170320 | A1* | 6/2014 | Yamamoto | C23C 16/402 427/255.7 |
| 2016/0148801 | A1* | 5/2016 | Yabe | C23C 16/402 438/778 |

(Continued)

FOREIGN PATENT DOCUMENTS

JP 2017-069407 A 4/2017

*Primary Examiner* — Jose R Diaz
(74) *Attorney, Agent, or Firm* — Volpe and Koenig, P.C.

(57) ABSTRACT

A technique capable of forming a film at the bottom of a deep hole having a high aspect ratio. A method of manufacturing a semiconductor device, including: (a) loading a substrate having a hole into a transfer space via a substrate loading/unloading port; (b) moving the substrate to a processing space; (c) forming a precursor in the hole by simultaneously supplying a first process gas to the substrate in the processing space and an inert gas into the transfer space with the processing space spatially connected to the transfer space and maintaining a difference between a first inner pressure of the processing space and a first inner pressure of the transfer space within a predetermined range; and (d) forming a thin film in the hole after performing (b).

16 Claims, 8 Drawing Sheets

(56) References Cited

U.S. PATENT DOCUMENTS

2016/0319424 A1* 11/2016 Takahashi ............ C23C 16/4412
2017/0183775 A1*  6/2017 Yamamoto ............ C23C 16/345
2017/0283949 A1* 10/2017 Yahata .................... C23C 16/46
2018/0158714 A1*  6/2018 Yahata .............. H01L 21/68707

* cited by examiner

METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of Japanese Patent Application No. 2018-020005, filed on Feb. 7, 2018, the entire contents of which are hereby incorporated by reference.

BACKGROUND

1. Field

The present disclosure relates to a method of manufacturing a semiconductor device.

2. Description of the Related Art

Recently, patterns contained in a semiconductor device are miniaturized. In order to manufacture the semiconductor device, for example, a film may be formed on a surface of a deep hole formed on a substrate.

As the patterns contained in the semiconductor devices are miniaturized, the aspect ratio of the deep hole is increased. Therefore, it is difficult to form the film at the bottom of the deep hole.

SUMMARY

Described herein is a technique capable of forming a film at the bottom of a deep hole having a high aspect ratio.

According to one aspect of the technique described herein, there is provided a method of manufacturing a semiconductor device, including: (a) loading a substrate having a hole into a transfer space via a substrate loading/unloading port; (b) moving the substrate to a processing space; (c) forming a precursor in the hole by simultaneously supplying a first process gas to the substrate in the processing space and an inert gas into the transfer space with the processing space spatially connected to the transfer space and maintaining a difference between a first inner pressure of the processing space and a first inner pressure of the transfer space within a predetermined range; and (d) forming a thin film in the hole after performing (b) by modifying the precursor by supplying a second process gas to the substrate in the processing space and the inert gas into the transfer space with the processing space spatially connected to the transfer space and maintaining a difference between a second inner pressure of the processing space and a second inner pressure of the transfer space within a predetermined range, wherein the second inner pressure of the processing space is higher than the first inner pressure of the processing space.

DETAILED DESCRIPTION

Figure 1:
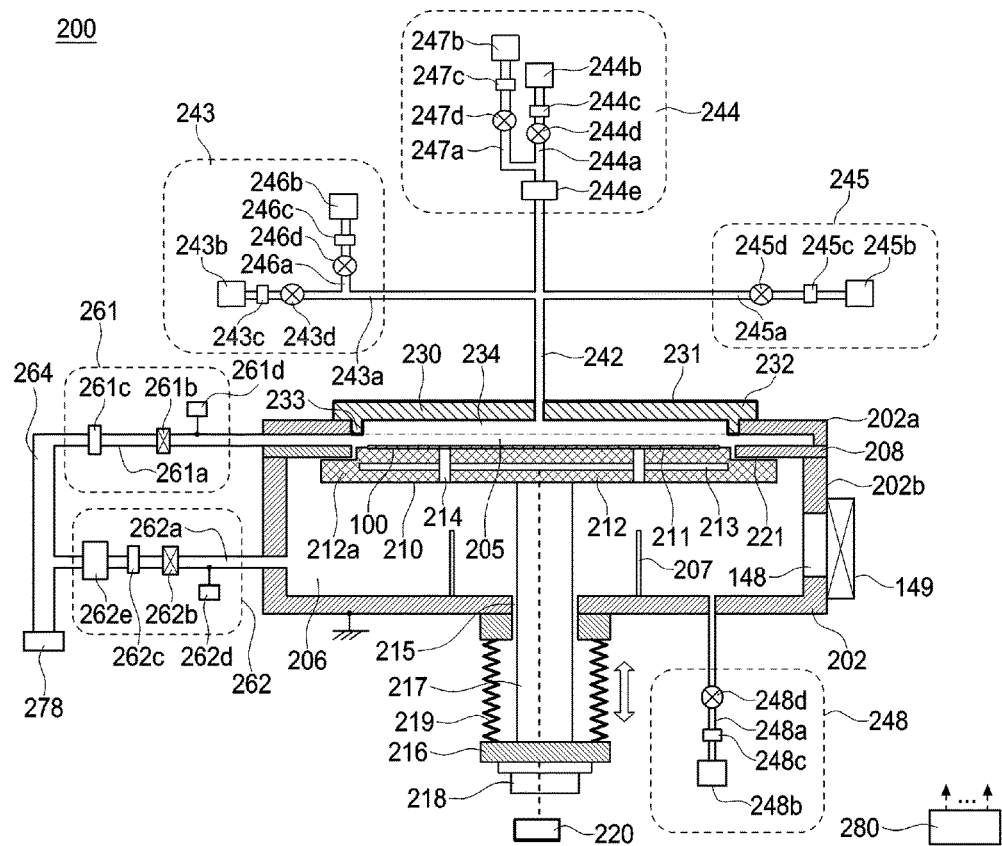
FIG. 1 schematically illustrates a substrate processing apparatus preferably used in an embodiment described herein.

Hereafter, a substrate processing apparatus 200 preferably used in an embodiment will be described with reference to FIG. 1.

<Process Vessel>

First, a process vessel 202 will be described. The substrate processing apparatus 200 includes the process vessel 202. For example, the process vessel 202 is a flat and sealed vessel having a circular horizontal cross-section. The process vessel 202 is made of a metal such as aluminum (Al) and stainless steel (SUS). A processing space 205 where a wafer (e.g. a silicon wafer) 100 is processed and a transfer space 206 through which the wafer 100 is transferred to the processing space 205. The process vessel 202 includes an upper vessel 202a and a lower vessel 202b. A partition plate 208 is provided between the upper vessel 202a and the lower vessel 202b.

A substrate loading/unloading port 148 is provided at a side wall of the lower vessel 202b adjacent to a gate valve 149. The wafer 100 is moved between a vacuum transfer chamber (not shown) and the transfer space 206 through the substrate loading/unloading port 148. Lift pins 207 are provided at the bottom of the lower vessel 202b. The lower vessel 202b is electrically grounded.

A substrate support 210 and a shower head 230 are provided in a process chamber including the processing space 205. The substrate support 210 supports the wafer 100. The substrate support 210 includes the substrate support member 212 having a substrate placing surface 211 on which the wafer 100 is placed and a heater (heating source) 213 provided in the substrate support member 212. Through-holes 214 penetrated by the lift pins 207 are provided at the substrate support 210 at locations corresponding to those of the lift pins 207. A heater temperature controller 220 for controlling the temperature of the heater 213 is connected to the heater 213.

The substrate support 210 is supported by a shaft 217. The shaft 217 penetrates a hole 215 provided at the bottom of the process vessel 202. The shaft 217 is coupled to an elevating mechanism 218 outside the process vessel 202 through a support plate 216. The wafer 100 placed on the substrate placing surface 211 is lifted and lowered by operating the elevating mechanism 218 by lifting and lowering the shaft 217 and the substrate support 210. Bellows 219 covers the periphery of the lower end of the shaft 217. The interior of the process vessel 202 is maintained airtight.

When the wafer 100 is to be transferred, the substrate support 210 is moved downward until the substrate placing surface 211 is at the height of the substrate loading/unloading port 148, i.e. until the substrate placing surface 211 reaches a wafer transfer position. When the wafer 100 is to be processed, the substrate support 210 is moved upward until the wafer 100 reaches a wafer processing position in the processing space 205 as shown in FIG. 1.

Specifically, when the substrate support 210 is lowered to the wafer transfer position, the upper ends of the lift pins 207 protrude from the upper surface of the substrate placing surface 211, and the lift pins 207 supports the wafer 100 from thereunder. When the substrate support 210 is elevated to the wafer processing position, the lift pins 207 are retracted from the upper surface of the substrate placing surface 211 and the substrate placing surface 211 supports the wafer 100 from thereunder.

The shower head 230 is provided at an upstream side of the processing space 205. The shower head 230 includes a cover 231. The cover 231 includes a flange 232. The flange 232 is supported by the upper vessel 202a. The cover 231 also includes a position guiding protrusion 233. The cover 231 is fixed by the position guiding protrusion 233 being engaged with the upper vessel 202a.

The shower head 230 includes a buffer space 234. The buffer space 234 refers to a space defined by the cover 231 and the position guiding protrusion 233. The buffer space 234 is spatially in communication with the processing space 205. A gas supplied into the buffer space 234 is diffused in the buffer space 232 and uniformly supplied to the processing space 205. According to the embodiment, the buffer space 234 and the processing space 205 are separate spaces. However, the above-described technique is not limited thereto. For example, the buffer space 234 may be included in the processing space 205.

The processing space 205 is defined by the upper vessel 202a and an upper surface of the substrate support member 212 at the wafer processing position. The processing space 205 may also be referred to as "process chamber." The structures defining the processing space 205 are not limited to the upper vessel 202a and the upper surface of the substrate support member 212.

The transfer space 206 is defined by the lower vessel 202b and a lower surface of the substrate support member 212 at the wafer processing position. The transfer space 206 may also be referred to as "transfer chamber," and is provided under the process chamber. The structures defining the transfer space 206 are not limited to the lower vessel 202b and the lower surface of the substrate support member 212.

<Gas Supply System>

Next, a gas supply system will be described. A first gas supply pipe 243a, a second gas supply pipe 244a and a third gas supply pipe 245a are connected to a common gas supply pipe 242. A fourth gas supply pipe 248a is connected to the lower vessel 202b.

A first process gas is supplied mainly though a first gas supply system 243 including the first gas supply pipe 243a. A second process gas is supplied mainly though a second gas supply system 244 including the second gas supply pipe 244a. An inert gas is supplied though a third gas supply system 245 including the third gas supply pipe 245a. The inert gas is also supplied though a fourth gas supply system 248 including the fourth gas supply pipe 248a.

<First Gas Supply System>

A first gas source 243b, a mass flow controller (MFC) 243c which is a flow rate controller (flow rate control mechanism) and a valve 243d which is an opening/closing valve are provided at the first gas supply pipe 243a in order from the upstream side to the downstream side of the first gas supply pipe 243a.

A gas containing a first element (hereinafter also referred to as "first process gas") is supplied into the shower head 230 via the mass flow controller 243c and the valve 243d provided at the first gas supply pipe 243a and the common gas supply pipe 242.

The first process gas is a source gas, that is, one of process gases. According to the embodiment, the first element may include silicon (Si). That is, the first process gas may include a silicon-containing gas such as dichlorosilane ($SiH_2Cl_2$, abbreviated as DCS) gas.

The downstream end of a first inert gas supply pipe 246a is connected to the first gas supply pipe 243a at the downstream side of the valve 243d provided at the first gas supply pipe 243a. An inert gas supply source 246b, a mass flow controller (MFC) 246c which is a flow rate controller (flow rate control mechanism) and a valve 246d which is an opening/closing valve are provided at the first inert gas supply pipe 246a in order from the upstream side to the downstream side of the first inert gas supply pipe 246a.

According to the embodiment, the inert gas may include nitrogen ($N_2$) gas. The inert gas acts as a carrier gas or a dilution gas for the source gas.

The first gas supply system 243 (also referred to as "silicon-containing gas supply system") is constituted by the first gas supply pipe 243a, the mass flow controller 243c and the valve 243d.

A first inert gas supply system is constituted by the first inert gas supply pipe 246a, the mass flow controller 246c and the valve 246d. The first inert gas supply system may further include the inert gas supply source 246b and the first gas supply pipe 243a.

The first gas supply system 243 may further include the first gas source 243b and the first inert gas supply system.

<Second Gas Supply System>

A reactive gas source 244b, a mass flow controller (MFC) 244c which is a flow rate controller (flow rate control mechanism) and a valve 244d which is an opening/closing valve are provided at the second gas supply pipe 244a in order from the upstream side to the downstream side of the second gas supply pipe 244a. A remote plasma unit (RPU) 244e may be provided at the downstream side of the valve 244d of the second gas supply pipe 244a to activate the reactive gas (second process gas) into plasma state.

The reactive gas is supplied into the shower head 230 via the mass flow controller 244c and the valve 244d provided at the second gas supply pipe 244a and the common gas supply pipe 242. The reactive gas is excited into in a plasma state by the RPU 244e, and then supplied onto the wafer 100.

The reactive gas is one of the process gases. The reactive gas may include an oxygen-containing gas such as oxygen ($O_2$) gas.

The second gas supply system (reactive gas supply system) 244 is constituted by the second gas supply pipe 244a, the mass flow controller 244c and the valve 244d. The second gas supply system 244 may further include the reactive gas source 244b, the RPU 244e and a second inert gas supply system which will be described later.

The downstream end of a second inert gas supply pipe 247a is connected to the second gas supply pipe 244a at the downstream side of the valve 244d provided at the second gas supply pipe 244a. An inert gas supply source 247b, a mass flow controller (MFC) 247c which is a flow rate controller (flow rate control mechanism) and a valve 247d which is an opening/closing valve are provided at the second inert gas supply pipe 247a in order from the upstream side to the downstream side of the second inert gas supply pipe 247a. An inert gas is supplied into the shower head 230 via the MFC 247c and the valve 247d provided at the second inert gas supply pipe 247a, the second gas supply pipe 244a and the RPU 244e.

According to the embodiment, the inert gas acts as a carrier gas or a dilution gas for the source gas. Specifically, the inert gas may include nitrogen ($N_2$) gas.

A second inert gas supply system is constituted by the second inert gas supply pipe 247a, the MFC 247c and the valve 247d. The second inert gas supply system may further include the inert gas supply source 247b, the second gas supply pipe 244a and the RPU 244e. As described above, the second gas supply system 244 may further include the second inert gas supply system.

<Third Gas Supply System>

A third gas source (inert gas source) 245b, a mass flow controller (MFC) 245c which is a flow rate controller (flow rate control mechanism) and a valve 245d which is an opening/closing valve are provided at the third gas supply pipe 245a in order from the upstream side to the downstream side of the third gas supply pipe 245a.

An inert gas serving as a purge gas is supplied into the shower head 230 via the mass flow controller 245c and the valve 245d provided at the third gas supply pipe 245a and the common gas supply pipe 242. For example, the inert gas includes nitrogen ($N_2$) gas.

The third gas supply system 245 is constituted by the third gas supply pipe 245a, the mass flow controller 245c and the valve 245d.

The inert gas supplied through the third gas source (inert gas source) 245b acts as the purge gas for purging residual gas in the processing vessel 202 or in the shower head 230 during a substrate processing.

The first gas supply system 243, the second gas supply system 244 and the third gas supply system 245 may be collectively referred to as "process gas supply system". The process gas supply system supplies the process gas into processing space. The process gas supply system may also refer to one of the first gas supply system 243, the second gas supply system 244, the third gas supply system 245 and combinations thereof.

<Fourth Gas Supply System>

A fourth gas source 248b, a mass flow controller (MFC) 248c which is a flow rate controller (flow rate control mechanism) and a valve 248d which is an opening/closing valve are provided at the fourth gas supply pipe 248a in order from the upstream side to the downstream side of the fourth gas supply pipe 248a.

An inert gas serving as a purge gas is supplied into the transfer space 206 via the mass flow controller 248c and the valve 248d provided at the fourth gas supply pipe 248a. For example, the inert gas includes nitrogen ($N_2$) gas.

The fourth gas supply system 248 is constituted by the fourth gas supply pipe 248a, the mass flow controller 248c and the valve 248d. The fourth gas supply system 248 is also referred to as an inert gas supply system for supplying the inert gas into the transfer space 206.

Recently, in order to improve the characteristics of a device or to form a new type of film, a film-forming process wherein gases are reacted at a low temperature is required. When the substrate is processed at a high temperature, the film formed on the substrate may be adversely affected.

There is a method wherein a gas containing a stable element is used in order to form a high quality film. However, since such method requires a high temperature for the chemical reaction, the requirement for the film-forming process at low temperature is not satisfied.

A plasma may be utilized in the film-forming process for forming a high-quality film at low temperature. For example, a structure for supplying electrical power may be added to the processing space 205 according to the embodiment to excite the gas supplied into the processing space 205 into plasma state by the electrical power. While plasma may be utilized at low temperature, the excited gas has high energy, which accelerates a CVD reaction above the deep hole, resulting in a film formed on the upper portion of the deep hole before the gas reaches the bottom of the deep hole. Thus, a film can not be formed at the bottom of the deep hole.

In order to solve the above problem, a gas which can be easily decomposed at a low temperature is used as the first process gas. A gas which can be decomposed at a low temperature or a gas in a low-energy plasma state generated using the remote plasma unit 244e is used as the second process gas. Simultaneously, the inner pressure of the processing space 205 is increased when the second process gas is supplied. As a result, the first process gas and the second process gas are supplied to the bottom of the deep hole.

<Exhaust System>

An exhaust system for exhausting an inner atmosphere of the process vessel 202 is constituted by a processing space exhaust system 261 for exhausting an inner atmosphere of the processing space 205 and a transfer space exhaust system 262 for exhausting an inner atmosphere of the transfer space 206.

The processing space exhaust system (process chamber exhaust system) 261 includes an exhaust pipe (first exhaust pipe) 261a connected to the processing space 205. The exhaust pipe 261a is spatially in communication with the processing space 205. An APC (Automatic Pressure Controller) 261c for adjusting the inner pressure of the processing space 205 to a predetermined pressure and a first pressure detector 261d for detecting the inner pressure of the processing space 205 are provided at the exhaust pipe 261a. The APC 261c includes an adjustable valve body (not shown). The APC 261c is configured to adjust the conductance of the exhaust pipe 261a in response to an instruction from a controller 280 which will be described later. A valve 261b is provided at the upstream side of the APC 261c provided at the exhaust pipe 261a. The exhaust pipe 261a, the valve 261b, the APC 261c and the first pressure detector 261d are collectively referred to as the processing space exhaust system 261.

The transfer space exhaust system (transfer chamber exhaust system) 262 includes an exhaust pipe (second exhaust pipe) 262a connected to the transfer space 206. The exhaust pipe 262a is connected to the transfer space 206 via the side wall or the bottom of the transfer space 206. An APC (Automatic Pressure Controller) 262c for adjusting the inner pressure of the transfer space 206 to a predetermined pressure. A pump (Turbo Molecular Pump, TMP) 262e may be provided at the exhaust pipe 262a. A valve (exhaust valve) 262b for the transfer space 206 is provided at the upstream side of the pump 262e of the exhaust pipe 262a. A second pressure detector 262d for detecting the inner pressure of the transfer space 206 is provided at the exhaust pipe 262a. The exhaust pipe 262a, the valve 262b, the APC 262c and the second pressure detector 262d are collectively referred to as the transfer space exhaust system 262. The transfer space exhaust system 262 may further include the pump 262e.

The exhaust pipe (third exhaust pipe) 264 is connected to the exhaust pipes 261a and 262a at the downstream sides of the exhaust pipes 261a and 262a. A dry pump (DP) 278 is provided at the exhaust pipe 264. As shown in FIG. 1, the exhaust pipe 262a and the exhaust pipe 261a are connected to the exhaust pipe 264 in order from the upstream side to the downstream side of the exhaust pipe 264. The DP 278 is provided at the exhaust pipe 264 at the downstream side of the portions to which the exhaust pipe 262a and the exhaust pipe 261a are connected. The DP 278 exhausts the inner atmosphere of the processing space 205 and the transfer space 206 through the exhaust pipe 262a and the exhaust pipe 261a, respectively. The DP 278 may operate as an auxiliary pump assisting the operation of the TMP 262e. That is, it is difficult for the TMP 262e, which is a high vacuum (or ultra-high vacuum) pump, to exclusively perform the exhaust to the atmospheric pressure. The DP 278 is used as an auxiliary pump for performing exhaust to atmospheric pressure. For example, an air valve may be used as each valve of the exhaust systems described above.

<Controller>

Figure 2:
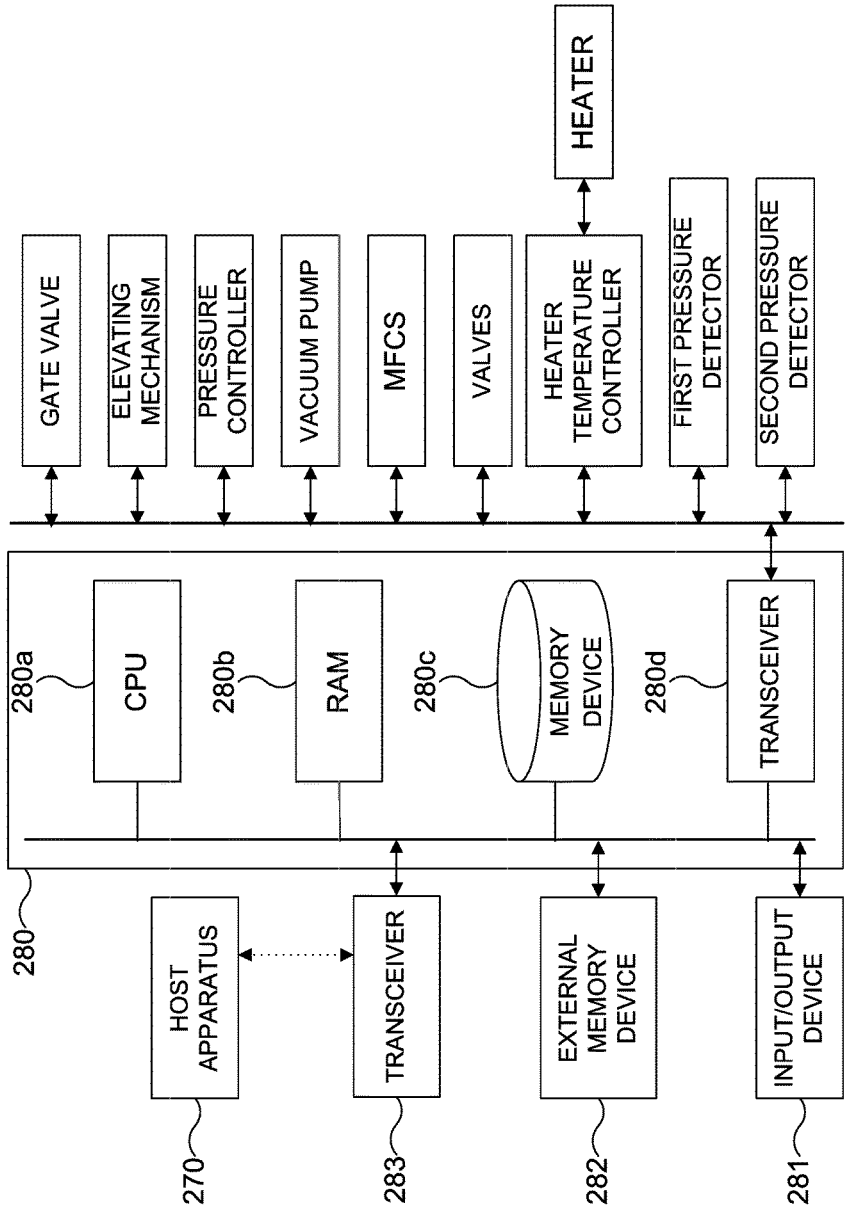
FIG. 2 is a block diagram schematically illustrating a configuration of a controller and components controlled by the controller of the substrate processing apparatus.

The substrate processing apparatus 200 includes the controller 280 configured to control components thereof. As shown in FIG. 2, the controller 280 includes at least a CPU (Central Processing Unit) 280a serving as an arithmetic unit, a RAM (Random Access Memory) 280b serving as a temporary memory unit, a memory device 280c and a transceiver 280d. The controller 280 is connected to the components of the substrate processing apparatus 200 via the transceiver 280d, calls a program or recipe from the memory device 280c in accordance with an instruction of a host controller or a user, and controls the operation of the components of the substrate processing apparatus 200 according to the contents of the instruction. The controller 280 may be embodied by a dedicated computer or as a general-purpose computer. According to the embodiment, the controller 280 may be embodied by preparing an external memory device 282 (e.g. a magnetic tape, a magnetic disk such as a flexible disk and a hard disk, an optical disk such as a CD and a DVD, a magneto-optical disk such as MO and a semiconductor memory such as a USB memory (USB flash drive) and a memory card) storing the program, and installing the program onto the general-purpose computer using the external memory device 282. The means for providing the program to the computer is not limited to the external memory device 282. The program can be supplied to the computer using communication means such as the Internet and a dedicated line. That is, the program may be provided to the computer without using the external memory device 282 by receiving the information (i.e., program) from a host apparatus 270 via a transceiver 283. A user can input an instruction to the controller 280 using an input/output device 281 such as a keyboard and a touch panel.

The memory device 280c or the external memory device 282 may be embodied by a non-transitory computer readable recording medium. Hereafter, the memory device 280c and the external memory device 282 are collectively referred to as recording media. Herein, "recording media" may refer to only the memory device 280c, only the external memory device 282 or both.

<Semiconductor Device>

Figure 3A:
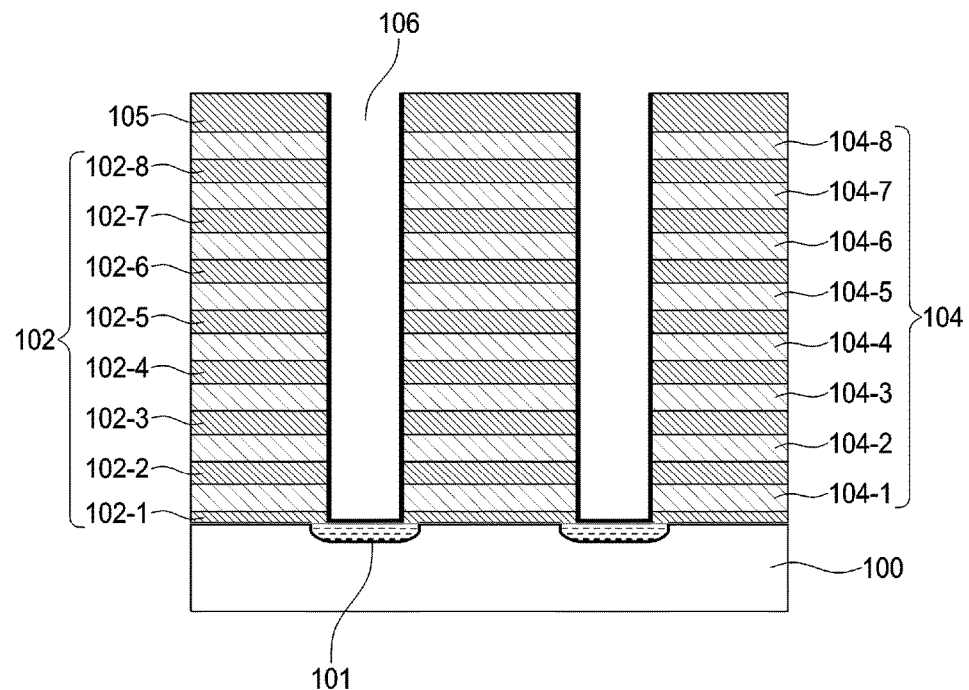
FIGS. 3A and 3B illustrate a cross-sectional view and a top view of a substrate having structures formed thereon, respectively.
Figure 3B:
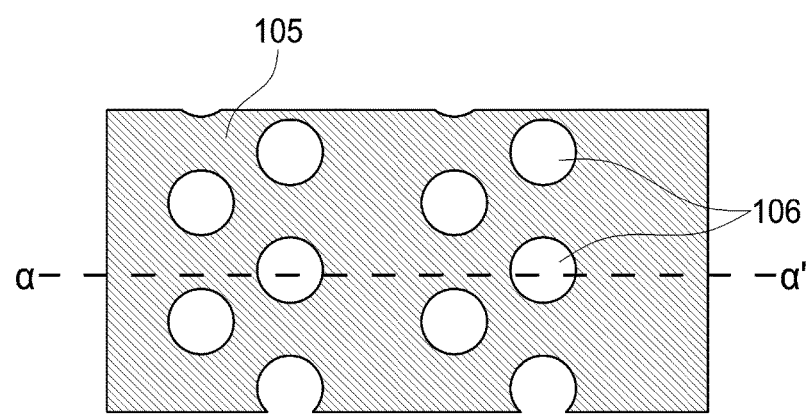
Figure 4:
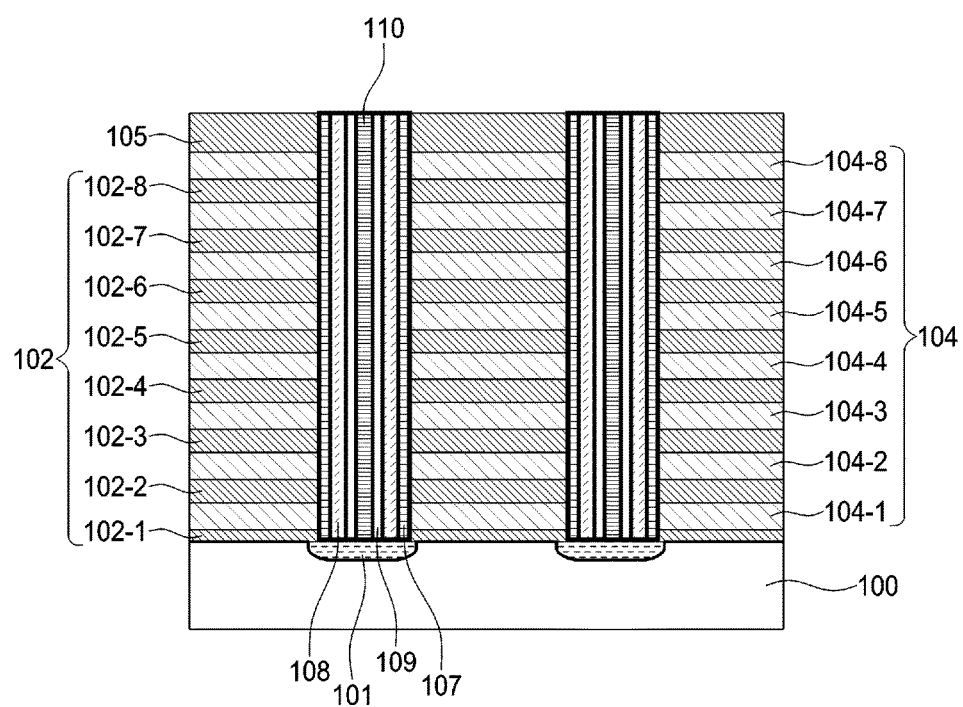
FIG. 4 illustrates a cross-sectional view the substrates and the films formed thereon.
Figure 5:
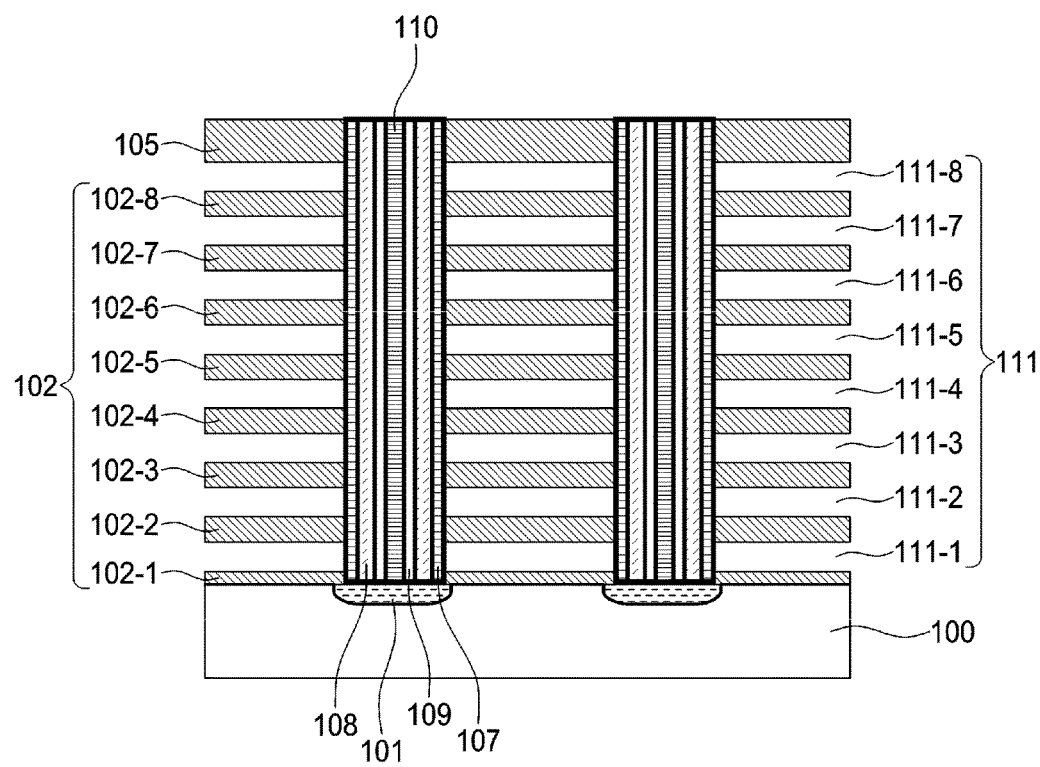
FIG. 5 illustrates a cross-sectional view the substrates and the films formed thereon.
Figure 6:
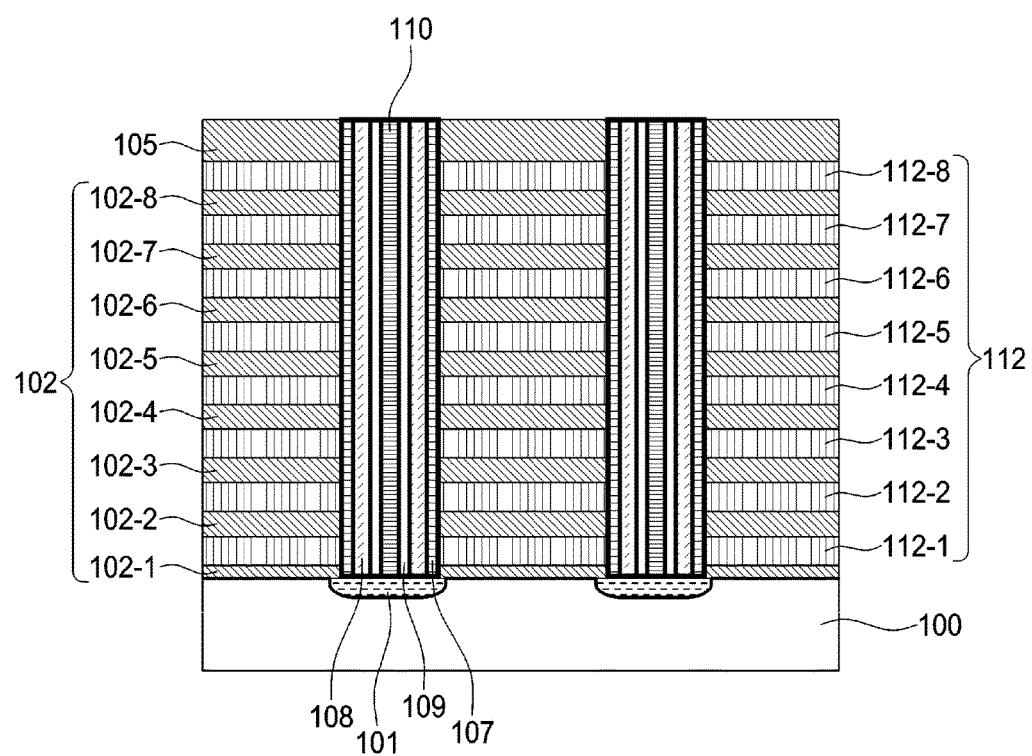
FIG. 6 illustrates a cross-sectional view the substrates and the films formed thereon.

Next, an example semiconductor device to be processed will be described with reference to FIGS. 3A through 6. The semiconductor device to be processed is, for example, a stack type memory device. FIGS. 3A and 3B illustrate a cross-sectional view and a top view of a wafer having structures formed thereon provided with holes 106, respectively. FIG. 4 illustrates a cross-sectional view the substrates and the films formed thereon with a charge trap film filling the holes 106 shown in FIGS. 3A and 3B, FIG. 5 illustrates a cross-sectional view the substrates and the films formed thereon having voids 111-1, 111-2, 111-3, 111-4, 111-5, 111-6, 111-7 and 111-8 (collectively referred to as "voids 111" hereinafter) formed by removing the sacrificial film 104, and FIG. 6 illustrates a cross-sectional view the substrates and the films formed thereon with metal films 112-1, 112-2, 112-3, 112-4, 112-5, 112-6, 112-7 and 112-8 (collectively referred to as "metal films 112" hereinafter) filling the voids 111.

First, the substrate (wafer) 100 and the films formed thereon to be processed according to the embodiment will be described with reference to FIGS. 3A and 3B. FIG. 3B is the top view of the substrates 100 and the films formed thereon provided with the holes 106, and FIG. 3A is the cross-sectional view taken along the line α-α' of FIG. 3B.

As shown in FIGS. 3A and 3B, common source lines (CSL) 101 are formed on the wafer 100. Thereafter, an insulating film 102 is formed on the wafer 100, and a sacrificial film 104 is then formed on the insulating film 102. As shown in FIGS. 3A and 3B, the insulating film 102 and the sacrificial film 104 are alternately stacked. Specifically, a sacrificial film 104-1 is formed on an insulating film 102-1, an insulating film 102-2 is formed on the sacrificial film 104-1, and a sacrificial film 104-2 is formed on the insulating film 102-2. Similarly, insulating films 102-3, 102-4, 102-5, 102-6, 102-7 and 102-8 and sacrificial films 104-3, 104-4, 104-5, 104-6, 104-7 and 104-8 are alternately formed on one another. An insulating film 105 is then formed on the sacrificial film 104-8. While eight layers of insulating films and eight layers of sacrificial films are alternately formed in the example shown in FIGS. 3A and 3B, the embodiment is not limited thereto. For example, insulating films of more then eight layers and sacrificial films of more than eight layers may be alternately stacked.

The deep holes 106 are formed in the insulating film 105 and the stacked structure including the insulating film 102 and the sacrificial film 104 as shown in FIGS. 3A and 3B. The holes 106 expose the common source line 101 at the bottom thereof. As shown in FIG. 3B, one or more holes 106 are provided in the substrate 100.

Next, Referring to FIG. 4, a protective film 107, a stacked film 108 including an inter-gate insulating film, a charge trap film and tunnel insulating film, a channel polysilicon film 109, and a filler insulating film 110 are formed in the holes 106 from the side wall surface toward the center of the hole 106. The protective film 107, the stacked film 108, the channel polysilicon film 109 and the filler insulating film 110 are cylindrical.

The protective film 107 is made of a material such as SiO and metal oxide. The stacked film 108 includes, for example, a stacked structure of SiO film-SiN film-SiO film stacked in order. The protective film 107 is provided on the side wall surface of the hole 106 to protect the stacked film 108 against the damages that may occur when removing the sacrificial film 104. After the holes 106 are filled with the films described above, the sacrificial film 104 is removed by etching.

FIG. 5 illustrates the wafer and the films formed thereon with the sacrificial film 104 removed by etching. As shown in FIG. 5, the voids 111, which are another form of deep holes, are formed when the sacrificial film 104 is removed. That is, the voids 111 and the insulating films 102 are alternately arranged.

FIG. 6 illustrates the wafer with the metal film 112 filled in the voids 111. As shown, the metal film 112 and the insulating film 102 are alternately stacked.

<Substrate Processing>

Figure 7:
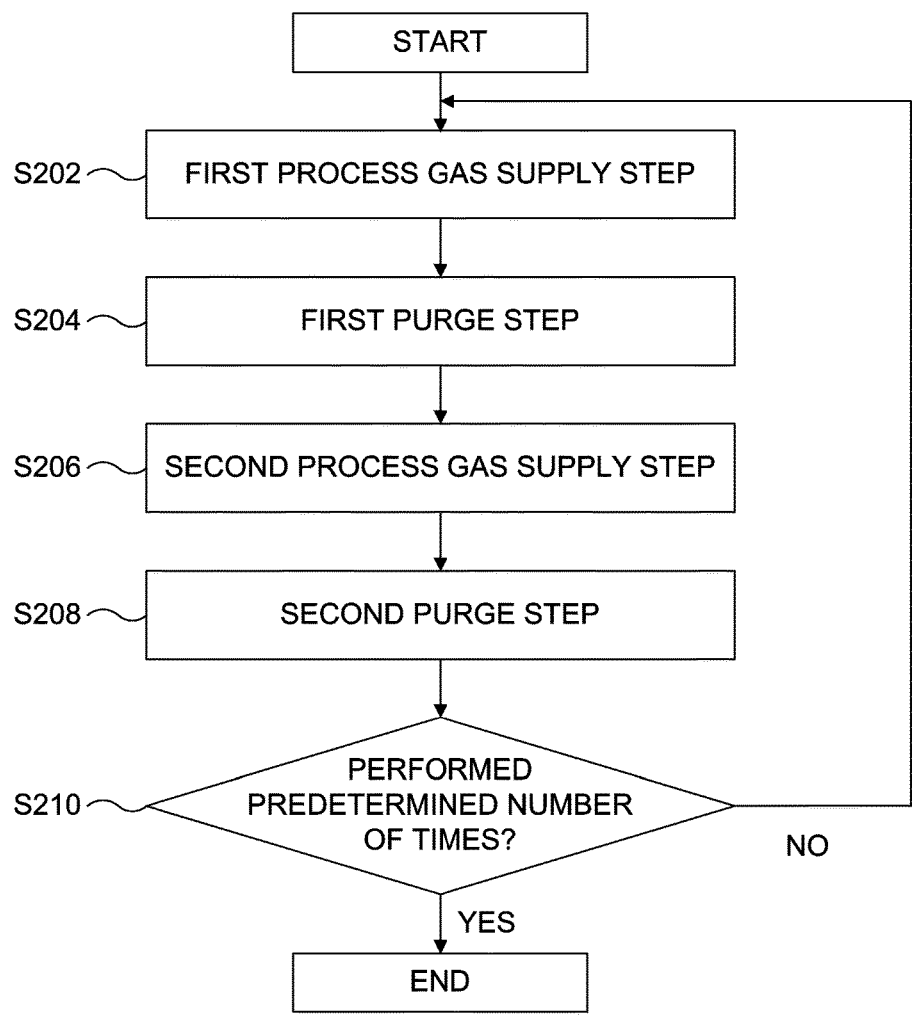
FIG. 7 is a flowchart illustrating a substrate processing according to the embodiment.
Figure 8:
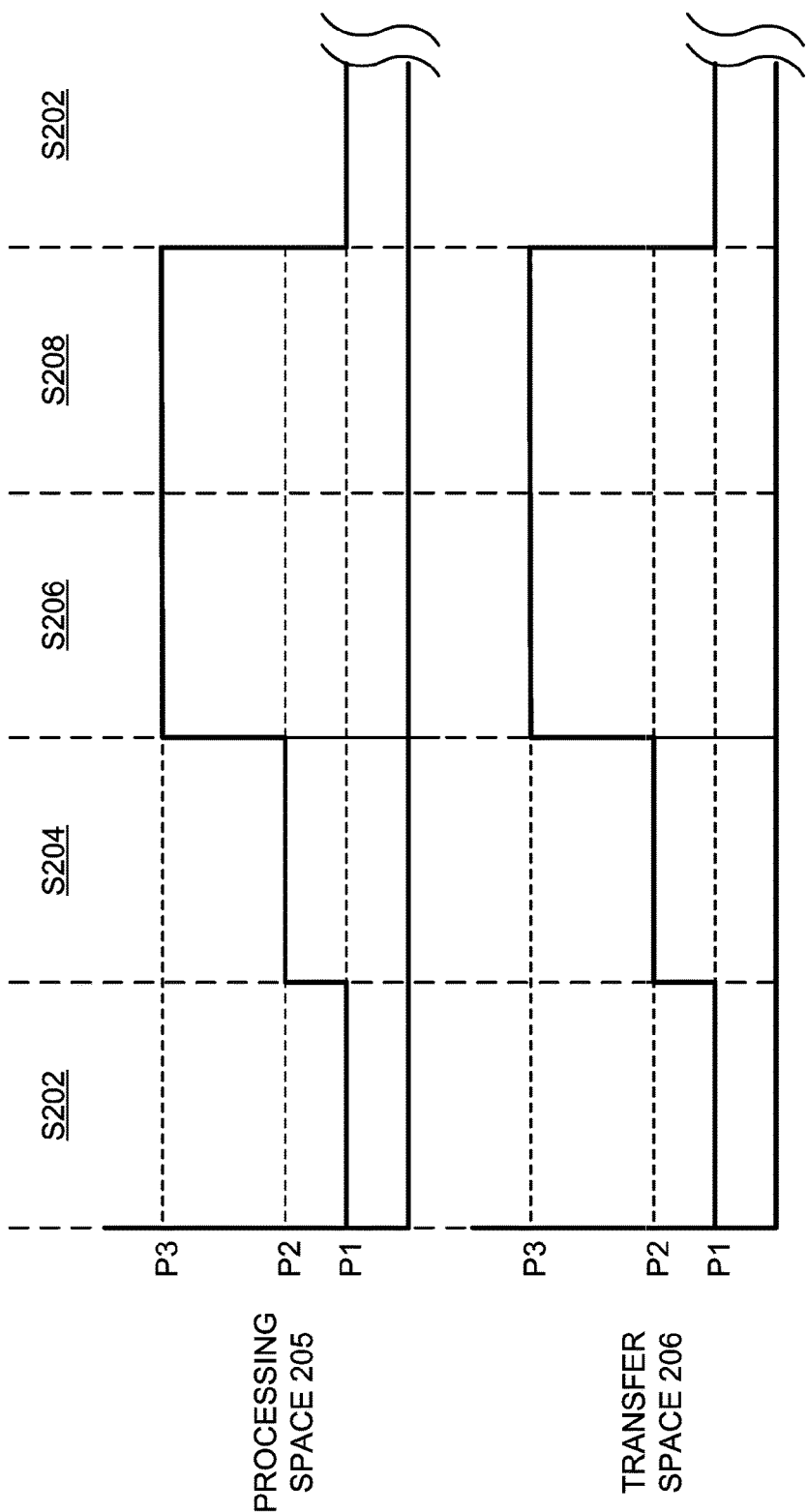
FIG. 8 illustrates inner pressures of a processing space and a transfer space during the substrate processing.

Hereafter, a substrate processing using the substrate processing apparatus 200 will be described with reference to FIGS. 7 and 8. FIG. 7 is a flowchart illustrating the substrate processing according to the embodiment, and FIG. 8 illustrates the inner pressures of the processing space and the transfer space during the substrate processing.

By performing the substrate processing, a film is formed in the holes 106 or voids 111, for example. The operations of the components of the substrate processing apparatus 200 are controlled by the controller 280.

<Substrate Loading and Placing Step>

A substrate loading and placing step will be described. The substrate loading and placing step is not shown in FIG. 7. The substrate support 210 of the substrate processing apparatus 200 is lowered to the position for transferring the wafer 100 (wafer transfer position). The lift pins 207 penetrate the through-holes 214 of the substrate support 210. As a result, the lift pins 207 protrude from the surface of the substrate support 210. Next, the valve 262b is opened to spatially connect the transfer space 206 to the APC 262c. The inner atmospheres of the processing space 205 and the transfer space 206 are then exhausted.

Next, the gate valve 149 is opened to spatially connect the transfer space 206 to the vacuum transfer chamber (not shown). The wafer 100 is transferred from the vacuum transfer chamber into the transfer space 206 using a wafer transfer device (not shown). The wafer 100 is then placed onto the lift pins 207 protruding from the surface of the substrate support 210 and is supported by the lift pins 207 in horizontal orientation.

After the wafer 100 is transferred into the process vessel 202, the wafer transfer device is retracted to the outside of the process vessel 202, and the gate valve 149 is closed to seal the process vessel 202. Thereafter, the substrate support 210 is elevated to transfer the wafer 100 to the substrate placing surface 211 and then further elevated until the wafer 100 is at the wafer processing position in the processing space 205.

The processing space 205 is isolated from the transfer space 206 by moving the flange 212a of the substrate support member 212 to the partition plate 208 as close as possible. However, if the flange 212a comes into contact with the partition plate 208, any material attached to the flange 212a and the partition plate 208 may be peeled off, or any one of the flange 212a and the partition plate 208 may be damaged, resulting in the generation of particles. In the case of processing micro-patterns as in the embodiment, the particles adversely affect the performance of the substrate processing apparatus, degrading the yield. In order to prevent the generation of the particles, the movement of the substrate support 210 is controlled such that a space 221 exists between the flange 212a and the partition plate 208 when the wafer 100 is at the wafer processing position. Due to the space 221, the processing space 205 is spatially connected to the transfer space 206.

After the wafer 100 reaches the wafer processing position in the processing space 205, the valve 261b is opened to spatially connect the processing space 205 to the APC 261c. The inner pressure of the processing space 205 is adjusted to a predetermined pressure (for example, a high vacuum of $10^{-5}$ Pa to $10^{-1}$ Pa) by adjusting the conductance of the exhaust pipe 261a with the APC 261c.

The inner pressure of the transfer space 206 is also adjusted to an inner pressure about the same as the inner pressure of the processing space 205 (for example, a high vacuum of $10^{-5}$ Pa to $10^{-1}$ Pa) by adjusting the conductance of the exhaust pipe 262a with the APC 262c.

When the wafer 100 is placed on the substrate support member 212, electrical power is supplied to the heater 213 embedded in the substrate support member 212 to adjust the temperature of the surface of the wafer 100 such that the temperature of the surface of the wafer 100 ranges, for example, from room temperature to 800° C., preferably from room temperature to 500° C. The controller 280 calculates a control value based on the temperature of the heater 213 detected by a temperature sensor (not shown), and controls the heater temperature controller 220 to control the energization state of the heater 213 based on the calculated control value to adjust the temperature of the wafer 100.

Next, a method of forming a thin film in the deep holes will be described in detail. Specifically, an example wherein the filler insulating film 110 including a silicon oxide film will be described with reference to FIGS. 7 and 8. FIG. 7 is a flowchart illustrating the substrate processing according to the embodiment, and FIG. 8 schematically illustrates pressures of the processing space and the transfer space during the substrate processing.

After the temperature of the wafer 100 is adjusted to a substrate processing temperature, the substrate processing according to the embodiment is performed while the temperature of the wafer 100 is maintained at the substrate processing temperature. That is, the wafer 100 is processed by supplying the process gases to the surface (process surface) of the wafer 100 in the process vessel 202 through the common gas supply pipe 242 and the shower head 230.

Hereinafter, an example wherein DCS gas and oxygen ($O_2$) gas are used as the first process gas and the second process gas, respectively, to form silicon oxide films in deep holes. According to the embodiment, the process of alternately supplying different process gases is repeated.

<First Process Gas Supply Step S202>

A first process gas supply step S202 will be described. In the first process gas supply step S202, the valve 243d is opened after the temperature of the wafer 100 reaches the desired temperature. The flow rate of the DCS gas is adjusted to a predetermined flow rate by the mass flow controller 234c. The amount of the supplied DCS gas may range from 100 sccm to 800 sccm. Simultaneously, $N_2$ gas is supplied onto the wafer 100 through the third gas supply pipe 245a by opening the valve 245d of the third gas supply system 245. The $N_2$ gas may be supplied through the first inert gas supply system. The inner pressure of the processing space 205 in the first process gas supply step S202 may be referred to as "first inner pressure of the processing space 205". The inner pressure of the transfer space 206 in the first process gas supply step S202 may be referred to as "first inner pressure of the transfer space 206".

Silicon component from thermally decomposed DCS gas supplied into the processing space 205 via the buffer space 234 is supplied onto the wafer 100. A silicon-containing layer (first element-containing layer) is formed on the surface of the deep holes when the silicon component comes into contact with the surface of the deep holes. The silicon-containing layer serves as a precursor for the films which will be formed later.

While the DCS gas is supplied to the processing space 205, the inert gas is supplied to the transfer space 206 through the fourth gas supply system 248. At this time, the controller 280 controls the transfer space exhaust system 262 and the fourth gas supply system 248 such that the difference between the inner pressures of the processing space 205 and the transfer space 206 is within a predetermined range. Specifically, the controller 280 controls the transfer space exhaust system 262 and the fourth gas supply system 248 such that the inner pressure of the processing space 205 is almost the same as that of the transfer space 206, or the inner pressure of the processing space 205 is slightly higher than that of the transfer space 206.

The first pressure detector 261*d* and the second pressure detector 262*d* detect the inner pressures of the processing space 205 and the transfer space 206, respectively. The controller 280 receives the inner pressures detected by the first pressure detector 261*d* and the second pressure detector 262*d*. The controller 280 controls the mass flow controller 243*c*, the mass flow controller 248*c*, the APC 261*c* and the APC 262*c* such that the difference between the inner pressures of the processing space 205 and the transfer space 206 is within the predetermined range.

The inner pressures of the processing space 205 and the transfer space 206 are gradually increased while maintaining the difference between the inner pressures of the processing space 205 and the transfer space 206 within the predetermined range at the beginning of the supply of the first process gas.

The inner pressures of the processing space 205 and the transfer space 206 are maintained within the predetermined range to prevent an abrupt change in the difference between the inner pressures of the processing space 205 and the transfer space 206 at the beginning of the supply of the first process gas. The abrupt change in the difference between the inner pressures may cause the inner atmosphere of the transfer space 206 and the gas in the space 221, which act as particles, to diffuse into the entire processing space 205. Particularly, when the inner pressure of the transfer space 206 is higher than that of the processing space 205, the particles may be diffused significantly. If the particles adhere to the wafer 100 or to the inner walls of the process chamber, the yield may be degraded. Therefore, it is preferable that the inner pressures of the processing space 205 and the transfer space 206 are maintained within the predetermined range to prevent the diffusion of the particles at the beginning of the supply of the first process gas.

When the inner pressures of the processing space 205 and the transfer space 206 are gradually increased, an abrupt change in the difference between the inner pressures is prevented.

During the first process gas supply step S202, the inner pressure of the transfer space 206 may be adjusted to be equal to or higher than that of the processing space 205 to prevent the DCS gas from entering the transfer space 206 from the processing space 205. FIG. 8 exemplifies a case where the inner pressure of the processing space 205 is equal to that of the transfer space 206 as P1. The pressure P1 is selected such that the decomposed first process gas does not recombine. For example, the pressure P1 is lower than the pressure at which the decomposed first process gas recombines.

At this time, each of the inner pressures of the processing space 205 and the transfer space 206 may range, for example, from 50 Pa to 300 Pa.

By adjusting the inner pressures of the processing space 205 and the transfer space 206 to above-described value, the mean free path of the silicon component becomes longer. As a result, the silicon component can reach the bottom of the deep holes. The longer mean free path means that the probability of collision of the decomposed DCS gas is decreased. That is, the longer mean free path means that that the probability of recombination of the decomposed DCS gas is low. Thus, the silicon component can reach the bottom of the deep holes in decomposed state. As a result, the precursor may be formed at the bottom of the deep holes.

After a predetermined time elapses, the valve 243*d* is closed to stop the supply of the DCS gas. Preferably, before closing the valve 243*d*, the controller 280 controls the mass flow controller 243*c*, the mass flow controller 248*c*, the APC 261*c* and the APC 262*c* such that the difference between the inner pressures of the processing space 205 and the transfer space 206 is within the predetermined range. It is preferable that the inner pressures of the processing space 205 and the transfer space 206 are changed gradually.

For example, the amount of the first process gas supplied and the amount of the inert gas supplied via the fourth gas supply system 248 are gradually decreased while maintaining the difference between the inner pressures within the predetermined range.

The inner pressures are appropriately adjusted to prevent an abrupt pressure difference. That is, the inner pressures of the processing space 205 and the transfer space 206 are gradually decreased such that the difference between the inner pressures is not changed abruptly.

When $N_2$ gas is supplied via the first inert gas supply pipe 246*a* while supplying the first process gas, the amount of the first process gas supplied to the processing space 205 or the inner pressure of the processing space 205 may be adjusted by taking the amount of $N_2$ gas supplied under consideration.

<First Purge Step S204>

A first purge step S204 will be described. In the first purge step S204, $N_2$ gas is supplied through the third gas supply pipe 245*a* by opening the valve 245*d* to purge the shower head 230 and the processing space 205. Simultaneously, $N_2$ gas is supplied through the fourth gas supply pipe 248*a* by opening the valve 248*d*. The controller 280 controls the mass flow controller 245*c*, the mass flow controller 248*c*, the APC 261*c* and the APC 262*c* such that the difference between the inner pressures of the processing space 205 and the transfer space 206 is within the predetermined range. For example, the controller 280 controls the mass flow controller 245*c*, the mass flow controller 248*c*, the APC 261*c* and the APC 262*c* such that the inner pressure of the processing space 205 is almost the same as that of the transfer space 206, or the inner pressure of the transfer space 206 is slightly higher than that of the processing space 205.

Similar to the first process gas supply step S202, in the first purge step S204, the first pressure detector 261*d* and the second pressure detector 262*d* detect the inner pressures of the processing space 205 and of the transfer space 206, respectively. The controller 280 controls the mass flow controller 245*c*, the mass flow controller 248*c*, the APC 261*c* and the APC 262*c* based on the inner pressures detected by the first pressure detector 261*d* and the second pressure detector 262*d* such that the difference between the inner pressures the processing space 205 and the transfer space 206 is within the predetermined range. For example, the controller 280 controls the mass flow controller 245*c*, the mass flow controller 248*c*, the APC 261*c* and the APC 262*c* based on the inner pressures detected by the first pressure detector 261*d* and the second pressure detector 262*d* such that the inner pressure of the processing space 205 is almost the same as that of the transfer space 206, or the inner pressure of the transfer space 206 is slightly higher than that of the processing space 205.

The inner pressures of the processing space 205 and the transfer space 206 are gradually increased while maintaining the difference between the inner pressures of the processing space 205 and the transfer space 206 within the predetermined range at the beginning of the supply of the $N_2$ gas.

The inner pressures are appropriately adjusted to prevent an abrupt pressure difference. That is, the inner pressures of the processing space 205 and the transfer space 206 are gradually increased such that the difference between the inner pressures is not changed abruptly.

The inner pressure of the transfer space 206 may be adjusted to be equal to or higher than that of the processing space 205 to prevent the residual gas in the processing space 205 from entering the transfer space 206 from the processing space 205. By preventing the residual gas from entering the transfer space 206, the generation of particles in the transfer space 206 due to the residual gas can be prevented.

During the first purge step S204, each of the inner pressures of the processing space 205 and the transfer space 206 is P2 which is higher than the pressure P1 as shown in FIG. 8. Preferably, the pressure P2 ranges from 50 Pa to 300 Pa. When the inner pressures P2 of the processing space 205 and the transfer space 206 are higher than P1, the flow velocity of the inert gas increases, and the replacement efficiency of the gas is improved. That is, the first process gas supplied in the first process gas supply step S202 may be promptly purged.

After a predetermined time elapses, the valve 245*d* is closed to stop the supply of the N$_2$ gas. Preferably, before closing the valve 245*d*, the controller 280 controls the mass flow controller 245*c*, the mass flow controller 248*c*, the APC 261*c* and the APC 262*c* such that the difference between the inner pressures of the processing space 205 and the transfer space 206 is within the predetermined range. It is preferable that the inner pressures of the processing space 205 and the transfer space 206 are changed gradually.

For example, the amount of the inert gas supplied via the third gas supply system 245 and the amount of the inert gas supplied via the fourth gas supply system 248 are gradually decreased while maintaining the difference between the inner pressures within the predetermined range.

The inner pressures are appropriately adjusted to prevent an abrupt pressure difference. That is, the inner pressures of the processing space 205 and the transfer space 206 are gradually decreased such that the difference between the inner pressures is not changed abruptly.

<Second Process Gas Supply Step S206>

A second process gas supply step S206 will be described. After the first purge step S204, the valve 244*d* is opened to supply oxygen gas into the processing space 205 via the shower head 230.

The flow rate of the oxygen gas is adjusted to a predetermined flow rate by controlling the mass flow controller 244*c*. The flow rate of the oxygen gas ranges, for example, from 100 sccm to 6,000 sccm. N$_2$ gas may be supplied as a carrier gas by the second inert gas supply system together with the oxygen gas. In the second process gas supply step S206, the valve 245*d* of the third gas supply system 245 is opened to supply N$_2$ gas through the third gas supply pipe 245*a*. The inner pressure of the processing space 205 in the second process gas supply step S206 may be referred to as "second inner pressure of the processing space 205". The inner pressure of the transfer space 206 in the second process gas supply step S206 may be referred to as "second inner pressure of the transfer space 206".

The oxygen gas is activated into plasma state by the remote plasma unit 244*e*. The oxygen gas in plasma state is supplied onto the wafer 100. By modifying the silicon-containing layer formed in the deep holes with the oxygen gas, a film containing silicon (Si) and oxygen (O) is formed on the wafer 100.

In the second process gas supply step S206, the valve 261*b* is opened and the inner pressure of the processing space 205 is adjusted to a predetermined pressure by the APC 261*c*. In the second process gas supply step S206, the inner pressure of the processing space 205 is higher than that of the processing space 205 in the first process gas supply step S202. The reason will be explained later.

While the oxygen gas is supplied to the processing space 205, the inert gas is supplied to the transfer space 206 through the fourth gas supply system 248. At this time, the controller 280 controls the transfer space exhaust system 262 and the fourth gas supply system 248 such that the difference between the inner pressures the processing space 205 and the transfer space 206 is within the predetermined range. Specifically, the controller 280 controls the transfer space exhaust system 262 and the fourth gas supply system 248 such that the inner pressure of the processing space 205 is almost the same as that of the transfer space 206, or the inner pressure of the transfer space 206 is slightly higher than that of the processing space 205.

Similar to the first process gas supply step S202, in the second process gas supply step S206, the first pressure detector 261*d* and the second pressure detector 262*d* detect the inner pressures of the processing space 205 and the transfer space 206, respectively. The controller 280 receives the inner pressures detected by the first pressure detector 261*d* and the second pressure detector 262*d*. Similar to the first process gas supply step S202, in the second process gas supply step S206, the controller 280 controls the mass flow controller 244*c*, the mass flow controller 248*c*, the APC 261*c* and the APC 262*c* such that the difference between the inner pressures the processing space 205 and the transfer space 206 is within the predetermined range.

The inner pressures of the processing space 205 and the transfer space 206 are gradually increased while maintaining the difference between the inner pressures of the processing space 205 and the transfer space 206 within the predetermined range at the beginning of the supply of the oxygen gas.

The inner pressures are appropriately adjusted to prevent an abrupt pressure difference. That is, the inner pressures of the processing space 205 and the transfer space 206 are gradually increased such that the difference between the inner pressures is not changed abruptly.

The inner pressure of the transfer space 206 may be adjusted to be equal to or higher than that of the processing space 205 to prevent the oxygen gas from entering the transfer space 206 from the processing space 205. As shown in FIG. 8, each of the inner pressures of the processing space 205 and the transfer space 206 is P3 which is higher than the pressure P1 in the first process gas supply step S202.

In the second process gas supply step S206, each of the inner pressures of the processing space 205 and the transfer space 206 may range, for example, from 100 Pa to 1,400 Pa. When each of the inner pressure of the processing space 205 and the inner pressure of the transfer space 206 is in the above-described range, oxygen component can reach the bottom of the deep holes such that the precursor at the bottom of the deep holes may be modified by the oxygen component. As a result, a thin film is formed at the bottom of the deep holes. When the second process gas in plasma state is supplied, the inner pressures of the processing space 205 and the transfer space 206 are adjusted such that the plasma is not deactivated.

After a predetermined time elapses, the valve 244*d* is closed to stop the supply of the oxygen gas. Preferably, before closing the valve 244*d*, the controller 280 controls the mass flow controller 244*c*, the mass flow controller 248*c*, the APC 261*c* and the APC 262*c* such that the difference between the inner pressures the processing space 205 and the transfer space 206 is within the predetermined range. It is preferable that the inner pressures of the processing space 205 and the transfer space 206 are changed gradually.

For example, the amount of the second process gas supplied and the amount of the inert gas supplied via the fourth gas supply system 248 are gradually decreased while maintaining the difference between the inner pressures within the predetermined range.

The inner pressures are appropriately adjusted to prevent an abrupt pressure difference. That is, the inner pressures of the processing space 205 and the transfer space 206 are gradually decreased such that the difference between the inner pressures is not changed abruptly.

When $N_2$ gas is supplied via the second inert gas supply pipe 247a while supplying the second process gas, the amount of the second process gas supplied to the processing space 205 or the inner pressure of the processing space 205 may be adjusted by taking the amount of $N_2$ gas supplied under consideration.

<Second Purge Step S208>

A second purge step S208 will be described. Similar to the first purge step S204, in the second purge step S208, $N_2$ gas is supplied through the third gas supply pipe 245a to purge the shower head 230 and the processing space 205. Simultaneously, $N_2$ gas is supplied through the fourth gas supply pipe 248a. The controller 280 controls the mass flow controller 245c, the mass flow controller 248c, the APC 261c and the APC 262c such that the difference between the inner pressures of the processing space 205 and the transfer space 206 is within the predetermined range. For example, the controller 280 controls the mass flow controller 245c, the mass flow controller 248c, the APC 261c and the APC 262c such that the inner pressure of the processing space 205 is almost the same as that of the transfer space 206, or the inner pressure of the transfer space 206 is slightly higher than that of the processing space 205.

The inner pressures of the processing space 205 and the transfer space 206 are gradually increased while maintaining the difference between the inner pressures of the processing space 205 and the transfer space 206 within the predetermined range at the beginning of the supply of the $N_2$ gas.

The inner pressures of the processing space 205 and the transfer space 206 in the second purge step S208 are higher than those of the processing space 205 and the transfer space 206 in first purge step S204, respectively. In the second purge step S208, each of the inner pressures of the processing space 205 and the transfer space 206 may range, for example, from 20 Pa to 300 Pa. When the inner pressures of the processing space 205 and the transfer space 206 in the second purge step S208 are higher than those of the processing space 205 and the transfer space 206 in first purge step S204, the flow velocity of the inert gas increases, and the replacement efficiency of the gas is improved. That is, the first process gas supplied via the second process gas supply step S206 may be promptly purged. As shown in FIG. 8, each of the inner pressures of the processing space 205 and the transfer space 206 is P3.

After a predetermined time elapses, the valve 245d is closed to stop the supply of the $N_2$ gas. Preferably, before closing the valve 245d, the controller 280 controls the mass flow controller 245c, the mass flow controller 248c, the APC 261c and the APC 262c such that the difference between the inner pressures the processing space 205 and the transfer space 206 is within the predetermined range. It is preferable that the inner pressures of the processing space 205 and the transfer space 206 are changed gradually.

For example, the amount of the inert gas supplied via the third gas supply system 245 and the amount of the inert gas supplied via the fourth gas supply system 248 are gradually decreased while maintaining the difference between the inner pressures within the predetermined range.

<Determination Step S210>

A determination step S210 will be described. The controller 280 determines whether a cycle including the step S202 through the step S208 is performed a predetermined number of times (n times).

When the controller 280 determines, in the determination step S210, that the cycle is not performed the predetermined number of times ("NO" in FIG. 7), the step S202 through the step S208 is performed again. When the controller 280 determines, in the determination step S210, that the cycle is performed the predetermined number of times ("YES" in FIG. 7), the substrate processing shown in FIG. 7 is terminated.

<Substrate Unloading Step>

In a substrate unloading step, the substrate support 210 is lowered from the wafer processing position to the wafer transfer position wherein the wafer 100 is supported by the lift pins 207 protruding from the surface of the substrate support 210. Next, the gate valve 149 is opened and the wafer 100 is unloaded from the process vessel 202 by the wafer transfer device (not shown).

As described above, thin films may be formed at the bottom of the deep holes having high aspect ratio.

While the technique is described in detail by way of the above-described embodiment, the above-described technique is not limited thereto. For example, according to the above-described embodiment, a silicon-containing gas and oxygen ($O_2$) gas are used as the first process gas and the second process gas, respectively, to form silicon oxide film in deep holes. However, the above-described technique is not limited thereto. Gases such as HCD ($Si_2Cl_6$) and TDMAS ($SiH[N(CH_3)_2]_3$), which are easily decomposed, may be used as the first process gas. A gas such as ozone gas or HO has may be used as the second process gas instead of the $O_2$ gas. Particularly, since ozone itself has a high energy, ozone is not required to be supplied in plasma state. Therefore, when the wafer is processed at high pressure where the plasma can be deactivated, ozone may be used as the second process gas.

For example, according to the above-described embodiment, $N_2$ gas is used as the inert gas. However, the above-described technique is not limited thereto. A gas which is not reactive with the process gas may be used as the inert gas. Rare gas such as helium (He) gas, neon (Ne) gas and argon (Ar) gas may be used as the inert gas.

According to the technique described herein, thin film may be formed at the bottom of the deep hole having a high aspect ratio.

What is claimed is:

1. A method of manufacturing a semiconductor device, comprising:

(a) loading a substrate having a hole into a transfer space via a substrate loading/unloading port;

(b) moving the substrate to a processing space;

(c) forming a precursor in the hole by simultaneously supplying a first process gas to the substrate in the processing space and an inert gas into the transfer space with the processing space spatially connected to the transfer space and maintaining a difference between a first inner pressure of the processing space and a first inner pressure of the transfer space within a predetermined range; and (d) forming a thin film in the hole after performing (b) by modifying the precursor by supplying a second process gas to the substrate in the processing space and the inert gas into the transfer space with the processing space spatially connected to the transfer space and maintaining a difference between a second inner pressure of the processing space and a second inner pressure of the transfer space within a predetermined range, wherein the second inner pressure of the processing space is higher than the first inner pressure of the processing space.

2. The method of claim 1, wherein the first inner pressure of the processing space is lower than a pressure whereat a decomposed first process gas recombines.

3. The method of claim 2, wherein the first inner pressure of the transfer space is equal to or higher than the first inner pressure of the processing space.

4. The method of claim 3, wherein the second inner pressure of the transfer space is equal to or higher than the second inner pressure of the processing space.

5. The method of claim 4, wherein the first process gas is easily decomposed.

6. The method of claim 3, wherein the first process gas is easily decomposed.

7. The method of claim 2, wherein the second inner pressure of the transfer space is equal to or higher than the second inner pressure of the processing space.

8. The method of claim 7, wherein the first process gas is easily decomposed.

9. The method of claim 2, wherein the first process gas is easily decomposed.

10. The method of claim 1, wherein the first inner pressure of the transfer space is equal to or higher than the first inner pressure of the processing space.

11. The method of claim 10, wherein the second inner pressure of the transfer space is equal to or higher than the second inner pressure of the processing space.

12. The method of claim 11, wherein the first process gas is easily decomposed.

13. The method of claim 10, wherein the first process gas is easily decomposed.

14. The method of claim 1, wherein the second inner pressure of the transfer space is equal to or higher than the second inner pressure of the processing space.

15. The method of claim 14, wherein the first process gas is easily decomposed.

16. The method of claim 1, wherein the first process gas is easily decomposed.

* * * * *